(12) United States Patent
Miura et al.

(10) Patent No.: US 12,044,725 B2
(45) Date of Patent: Jul. 23, 2024

(54) INSPECTION DEVICE AND METHOD

(71) Applicant: Nippon Telegraph and Telephone Corporation, Tokyo (JP)

(72) Inventors: Toru Miura, Tokyo (JP); Yoshiho Maeda, Tokyo (JP); Hiroshi Fukuda, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 186 days.

(21) Appl. No.: 17/619,846

(22) PCT Filed: Jun. 17, 2019

(86) PCT No.: PCT/JP2019/023855
§ 371 (c)(1),
(2) Date: Dec. 16, 2021

(87) PCT Pub. No.: WO2020/255190
PCT Pub. Date: Dec. 24, 2020

(65) Prior Publication Data
US 2022/0349936 A1     Nov. 3, 2022

(51) Int. Cl.
*G01R 31/28* (2006.01)
*G01M 11/00* (2006.01)
*G01R 1/02* (2006.01)
*G01R 1/04* (2006.01)
*G01R 1/067* (2006.01)
*G01R 1/073* (2006.01)
*G01R 1/44* (2006.01)

(52) U.S. Cl.
CPC ......... *G01R 31/2887* (2013.01); *G01M 11/30* (2013.01)

(58) Field of Classification Search
CPC .... G01R 31/02; G01R 31/28; G01R 31/2887; G01R 1/02; G01R 1/04; G01R 1/067; G01R 1/071; G01R 1/073; G01R 1/07; G01R 1/44
See application file for complete search history.

(56) References Cited

U.S. PATENT DOCUMENTS

| 2015/0211960 A1* | 7/2015 | Shimizu | G01M 11/33 356/73.1 |
| 2021/0208182 A1* | 7/2021 | Lou | G01R 31/2889 |

FOREIGN PATENT DOCUMENTS

JP     H0387039 A     4/1991

OTHER PUBLICATIONS

Zhang, Rong et al., "A Novel Algorithm for Fiber-Optic Alignment Automation," IEEE Transactions of Advanced Packaging, vol. 27, No. 1, Feb. 2004, pp. 173-178.

* cited by examiner

*Primary Examiner* — Neel D Shah
(74) *Attorney, Agent, or Firm* — Slater Matsil, LLP

(57) ABSTRACT

A stage, electric probes, an optical probe, an electric measurement device, an optical measurement device, and a first positioning mechanism are provided. The stage includes a second positioning mechanism that changes relative positional relationship between the electric probes and an electric connection portion of each of the optical elements. The electric probes electrically connect the electric measurement device and each of the optical elements. The optical probe optically connects the optical measurement device and each of the optical elements. The first positioning mechanism changes relative positional relationship between the optical probe and an optical connection portion of each of the optical elements.

16 Claims, 8 Drawing Sheets

INSPECTION DEVICE AND METHOD

CROSS-REFERENCE TO RELATED APPLICATION

This application is a national phase entry of PCT Application No. PCT/JP2019/023855, filed on Jun. 17, 2019, which application is hereby incorporated herein by reference.

TECHNICAL FIELD

The present invention relates to an inspection apparatus and an inspection method of inspecting an optical device.

BACKGROUND

An inspection apparatus illustrated in FIG. 6 has been used for inspection and measurement of an optical circuit. In a case of performing the inspection and the measurement of the optical circuit by using the inspection apparatus, characteristics of the optical circuit are evaluated in such a manner that a chip 502 that is formed by cutting out the optical circuit fabricated on a wafer is fixed on a stage 501, light is caused to enter the chip 502 from one of optical fibers 503, and light having passed through the optical circuit on the chip 502 is received by the other optical fiber 503, a photodetector (not illustrated), or the like.

For example, in a case where the optical fibers 503 are used for input/output of the light, the inspection and the measurement are performed by a procedure of fixing the chip 502 to a fixing unit on the stage 501, aligning the optical fiber 503 on an incident side, and then aligning the optical fiber 503 on an emission side. Further, a plurality of chips are evaluated by replacing the chip 502 to the other chip 502 and repeating the above-described procedure after one chip 502 is evaluated. Alignment between the chip 502 and the optical fibers 503 is performed by using an automatic six-axis alignment unit 504. Since the automatic six-axis alignment unit 504 has six axes to be aligned, it takes a long time to align the axes, which increases the cost. As disclosed in Non-Patent Literature 1, the alignment method is tried to be improved.

CITATION LIST

Non-Patent Literature

Non-Patent Literature 1: Rong Zhang and Frank G. Shi, "A Novel Algorithm for Fiber-Optic Alignment Automation", IEEE TRANSACTIONS ON ADVANCED PACKAGING, vol. 27, no. 1, pp. 173-178, 2004.

SUMMARY

Technical Problem

In the case where the optical fibers for light incident/light emission are aligned for each chip and the optical circuit formed into a chip is inspected as described above, alignment of each of the optical fiber for light incident and the optical fiber for light emission is necessary for each evaluation. In this inspection, since replacement of the chip is necessary, automation is not easy. Alignment is largely shifted every time the chip is replaced, and it is necessary to perform both of rough alignment and fine alignment for the alignment. Therefore, it takes a long time to inspect the chip, which increases an inspection cost as a result.

Most of a manufacturing cost of the current optical device is occupied by the inspection and assembly, and increase in inspection speed (cost reduction) directly leads to cost reduction of the optical device. Further, selecting a defective chip by the inspection makes it possible to reduce an assembly cost of the defective chip.

In manufacturing of an electronic device such as a large-scale integration (LSI) and a complementary metal-oxide-semiconductor (CMOS) device, the electronic device is inspected in a state of a wafer, which allows for acceleration and automation of the inspection. If the optical device can be similarly inspected in a state of the wafer, the inspection can be accelerated and automated. The optical device, however, requires alignment of a light incident unit and a light emission unit for evaluation of optical characteristics, in addition to positioning of an electric probe.

The current wafer inspection apparatus does not include an optical probe and does not have an apparatus configuration in which the electric probe and the optical probe are simultaneously connected to the wafer, because the current wafer inspection apparatus is used only for inspection of the electronic device. Further, as described above, it is necessary to perform positioning of the optical probe independently of the positioning of the electric probe. However, the current wafer inspection apparatus does not have an apparatus configuration in which the electric probe and the optical probe are independently positioned to the wafer. Therefore, the current wafer inspection apparatus cannot measure the optical device.

The present invention is made to solve the above-described issues, and an object of the present invention is to enable inspection of an optical device in a shorter time.

Means for Solving the Problem

An embodiment inspection apparatus according to the present invention includes: a stage on which a wafer is to be placed, the wafer being formed with a plurality of optical elements each provided with an optical circuit to be inspected; an electric measurement device configured to perform electric measurement of each of the optical elements; an optical measurement device configured to perform optical measurement of each of the optical elements; electric probes configured to electrically connect the electric measurement device and each of the optical elements; and an optical probe configured to optically connect the optical measurement device and each of the optical elements.

An embodiment inspection method according to the present invention is an inspection method using the above-described inspection apparatus. The inspection method includes: a first step of placing a wafer on the stage, the wafer being formed with a plurality of optical elements each provided with an optical circuit to be inspected; a second step of performing rough alignment between the optical probe and an optical connection portion of the optical elements by causing the first positioning mechanism to change relative positional relationship between the optical probe and the optical connection portion of the optical elements; a third step of performing, after the rough alignment between the optical probe and the optical connection portion of the optical elements, alignment between the optical probe and the optical connection portion of the optical elements to maximize intensity of light entering the optical elements from the optical probe or intensity of light output from the optical elements to the optical probe; a fourth step of performing positioning between the electric probes and an electric connection portion of the optical elements by causing the second positioning mechanism to change relative positional relationship between the electric probes and the electric connection portion of the optical elements, and electrically connecting the electric probes and the optical elements; and a fifth step of performing, after the electric probes and the optical elements are electrically connected and the alignment between the optical probe and the optical connection portion of the optical elements is performed, electric measurement of the optical elements by the electric measurement device and optical measurement of the optical elements by the optical measurement device.

Effects of the Invention

As described above, according to the present invention, since the electric measurement device, the optical measurement device, the electric probes, and the optical probe are provided, it is possible to inspect the optical device in a shorter time.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
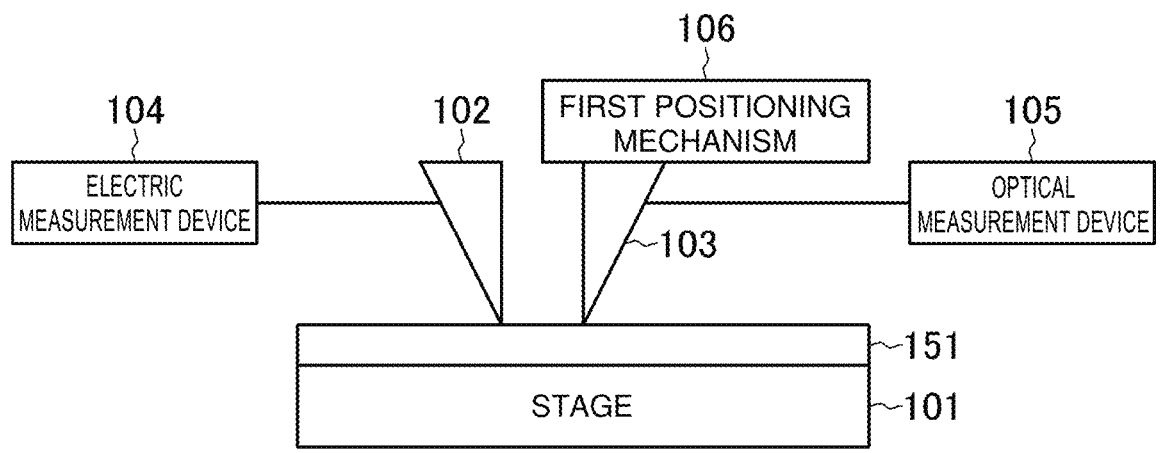
FIG. 1 is a configuration diagram illustrating a configuration of an inspection apparatus according to an embodiment of the present invention.

An inspection apparatus according to an embodiment of the present invention is described below with reference to FIG. 1, FIG. 2A, FIG. 2B, FIG. 2C, and FIG. 2D. The inspection apparatus includes a stage 101, electric probes 102, an optical probe 103, an electric measurement device 104, and an optical measurement device 105.

A wafer 151 is placed on the stage 101. The wafer 151 includes a plurality of optical elements each including an optical circuit and an electric circuit to be inspected.

The electric probes 102 electrically connect the electric measurement device 104 and each of the optical elements. The electric probes 102 are provided in a probe card 102a. The probe card 102a includes the plurality of electric probes 102 corresponding to a plurality of terminals of each of the optical elements. Further, the probe card 102a is fixed to a prober housing 107. The electric measurement device 104 performs electric measurement of each of the optical elements. The electric measurement device 104 performs measurement and application of a current and a voltage. In a common electronic device inspection apparatus, a stage including a wafer movement mechanism (second positioning mechanism) and detachable electric probes (probe card) are integrally formed, and a tester in which a power supply, an ammeter, and a voltmeter for electric measurement are integrated is provided as an electric measurement device.

The optical probe 103 optically connects the optical measurement device and each of the optical elements. The optical probe 103 is a multicore probe, and can be configured by, for example, an optical fiber array 103a. Alternatively, the multicore optical probe 103 can be configured by a planar light wave circuit. The optical measurement device 105 performs optical measurement of each of the optical elements. As described above, the inspection apparatus according to the embodiment includes one multicore optical probe 103. As described above, when the multicore optical probe 103 configured by the optical fiber array, the planar light wave circuit, or the like is used, light input/output with each of the optical elements can be performed by one optical probe 103.

Further, the inspection apparatus according to the embodiment includes a first positioning mechanism 106 that changes relative positional relationship between the optical probe 103 and an optical connection portion of each of the optical elements. The first positioning mechanism 106 can change the relative positional relationship between the optical probe 103 and the optical connection portion of each of the optical elements in six directions that are three directions orthogonal to one another and three rotation directions around the respective three directions. In other words, the first positioning mechanism 106 can perform alignment in six axes. The inspection apparatus according to the embodiment further includes a second positioning mechanism that changes relative positional relationship between the electric probes 102 and an electric connection portion of each of the optical elements. For example, the stage 101 includes the second positioning mechanism.

The first positioning mechanism 106 can be configured by a hexapod 111 having six degrees of freedom. The first positioning mechanism 106 is disposed above the stage 101 and the probe card 102a, and the optical fiber array 103a is held (fixed) to a lower portion of the first positioning mechanism 106 (hexapod 111). In addition, the probe card 102a includes a large opening enabling the optical fiber array 103a to access the wafer 151 positioned below the probe card 102a.

Light is caused to enter each of the optical elements by using the optical probe 103. Further, light emitted from each of the optical elements is received by the optical probe 103. The optical probe 103 is driven by the first positioning mechanism 106 independently of the stage tot. The optical probe 103 can access each of the optical elements on the wafer 151 independently of the electric probes 102. Each of the optical elements includes an optical coupling element such as a grating coupler to/from which light is input/output from a surface side of the wafer 151. The optical probe 103 and each of the optical elements are optically connected (coupled) through the corresponding optical coupling element described above. Alignment between the optical probe 103 and each of the optical elements means alignment between the optical probe 103 and each of the optical coupling elements.

Figure 2A:
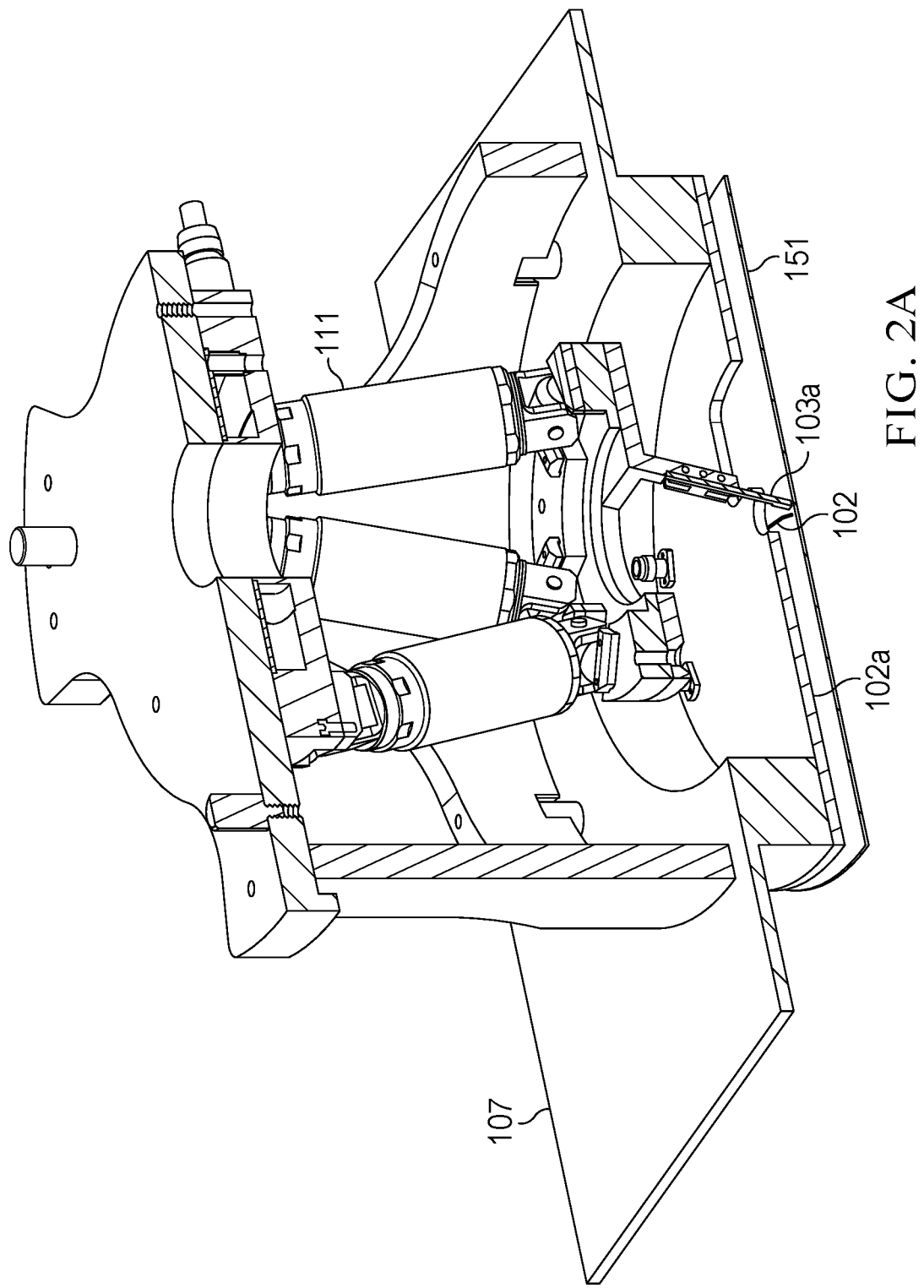
FIG. 2A is an image by computer graphics illustrating a partial configuration of the inspection apparatus according to an embodiment of the present invention.
Figure 2B:
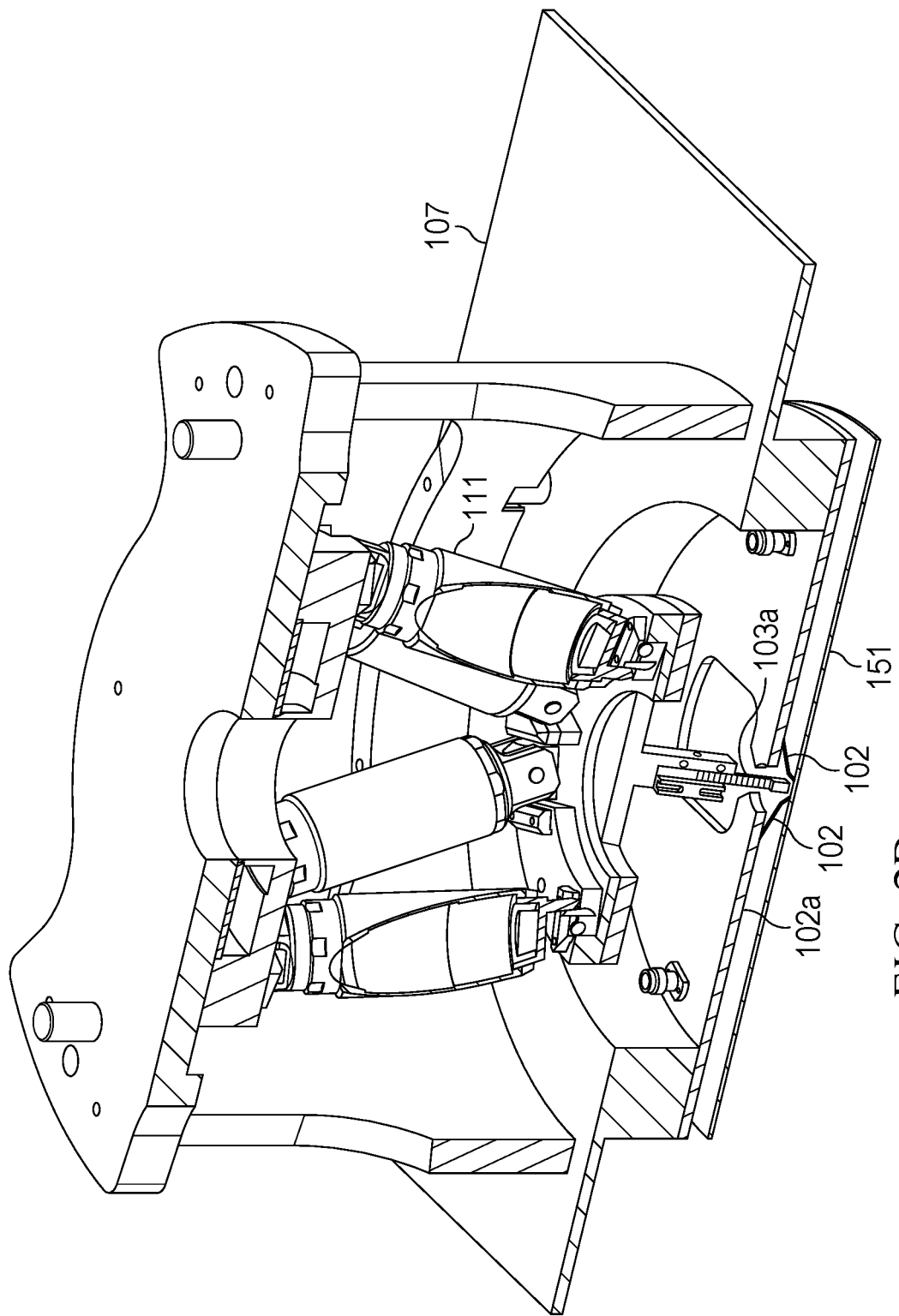
FIG. 2B is an image by computer graphics illustrating a partial configuration of the inspection apparatus according to an embodiment of the present invention.
Figure 2C:
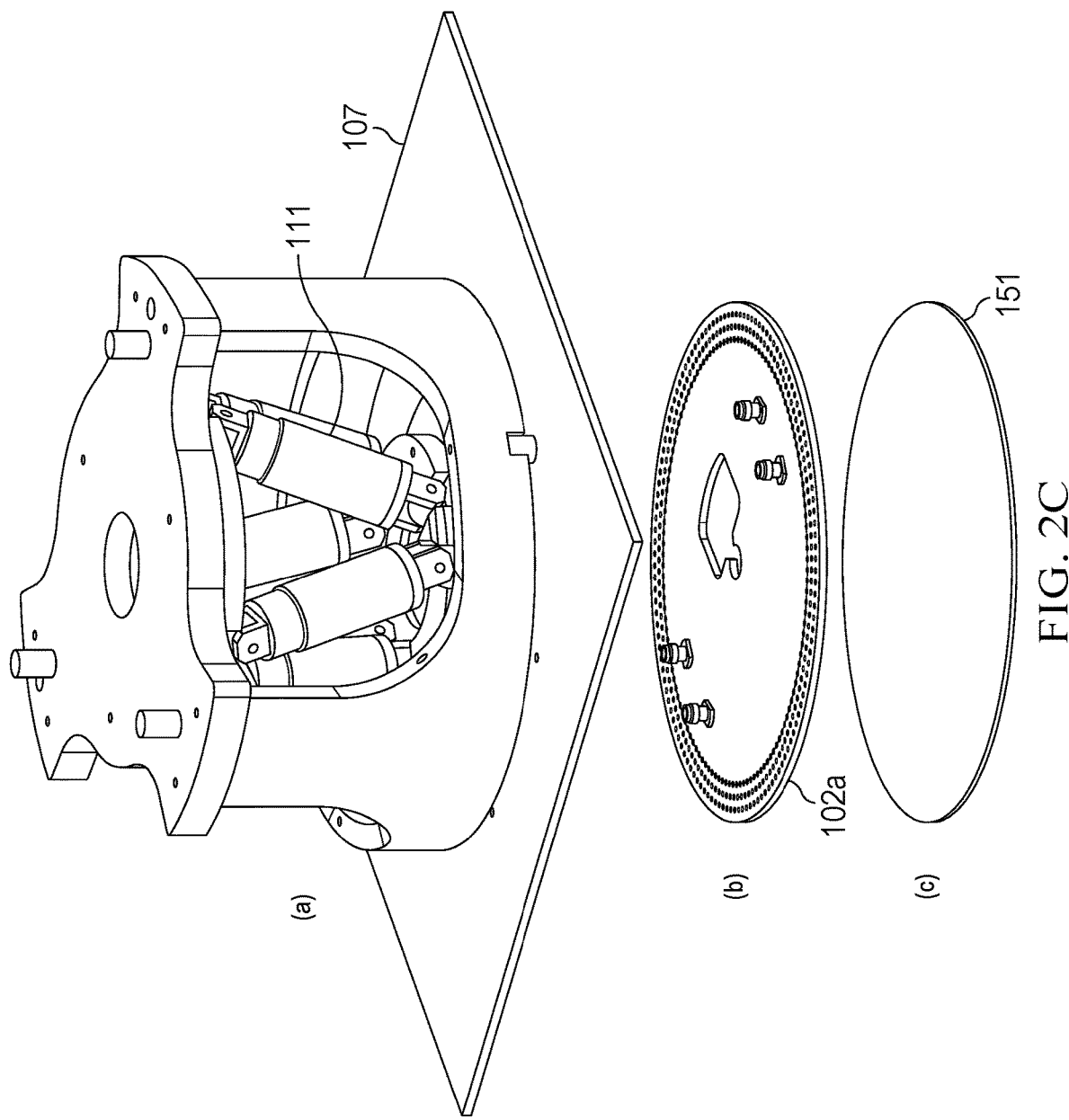
FIG. 2C is an image by computer graphics illustrating a partial configuration of the inspection apparatus according to an embodiment of the present invention.
Figure 2D:
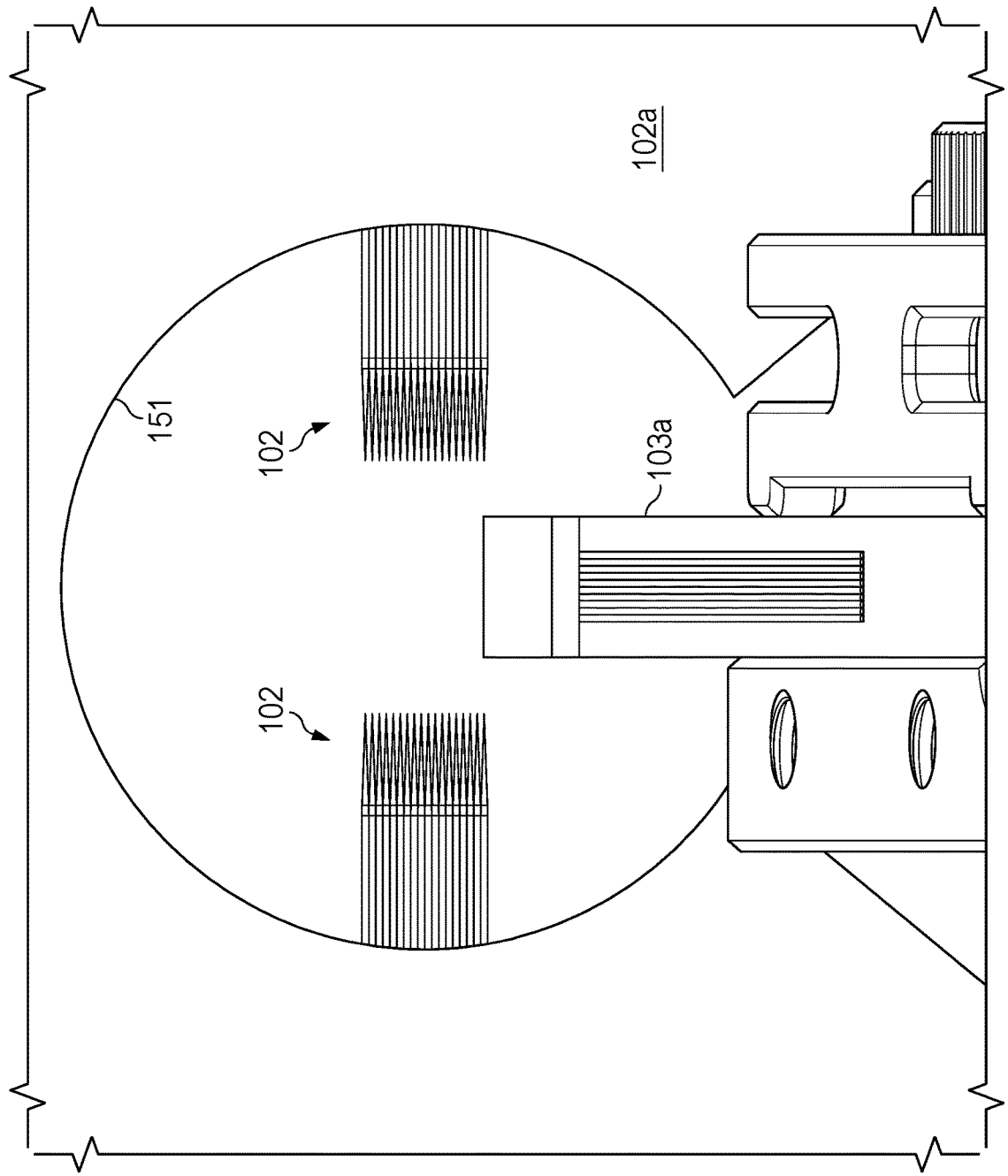
FIG. 2D is an image by computer graphics illustrating a partial configuration of the inspection apparatus according to an embodiment of the present invention.

The hexapod 111 is suspended just above the probe card 102a (prober housing 107) so as to minimize possibility of interference with the other devices and the electric circuit. The wafer 151 is conveyed by an unillustrated conveyance mechanism and is disposed on the stage 101 below the probe card 102a and the optical fiber array 103a. FIG. 2D illustrates an example of relative positional relationship between the electric probes 102 and the optical fiber array 103a as viewed from above the probe card 102a. The optical fiber array 103a is inserted into the opening of the probe card 102a from above and is disposed so as not to contact with the electric probes 102.

Figure 3:
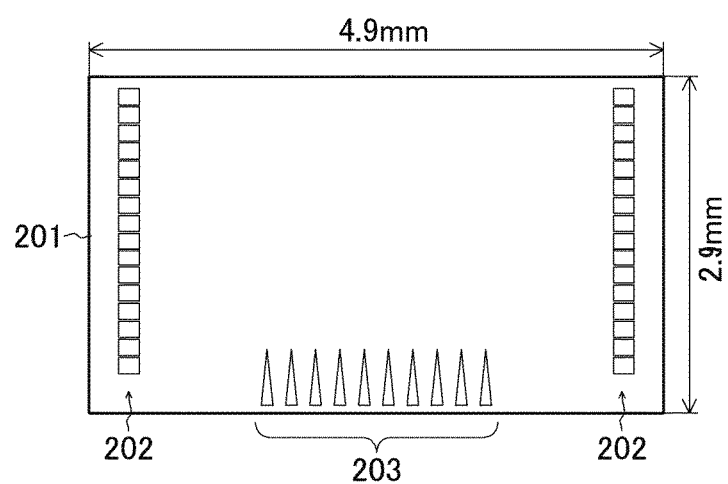
FIG. 3 is a plan view illustrating a configuration of a unit cell in which optical elements to be inspected are provided.
Figure 4:
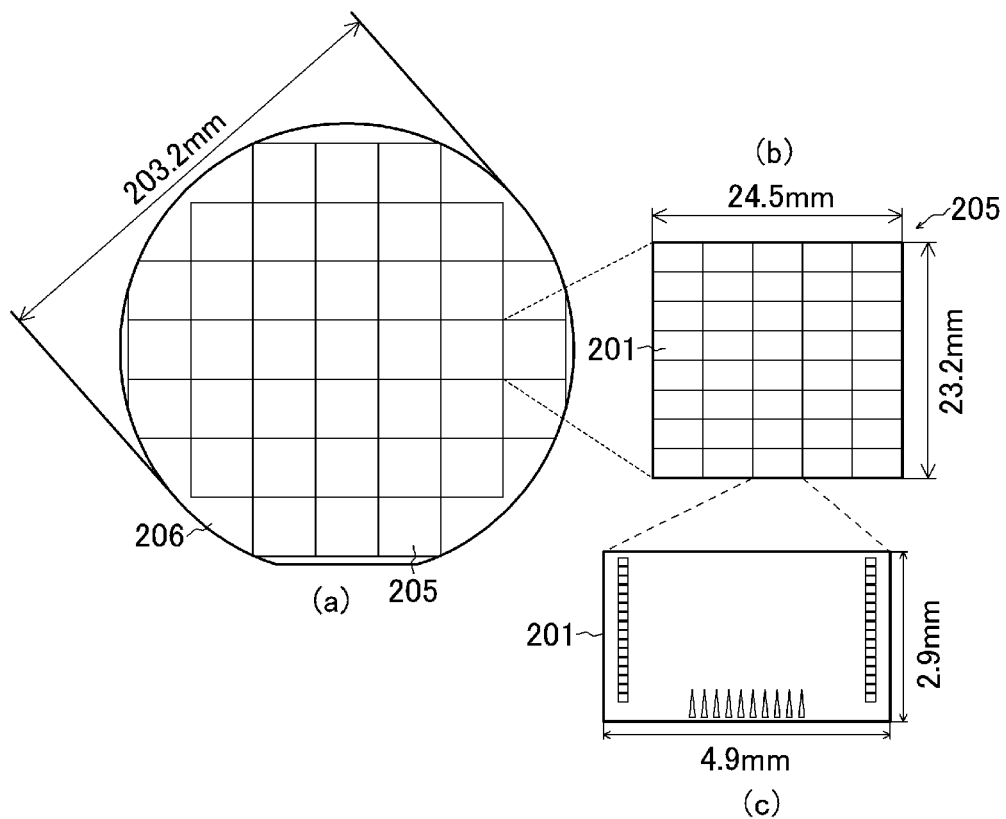
FIG. 4 is a plan view illustrating a state where a plurality of dies each including a plurality of arranged unit cells are arranged on a wafer.

For example, the optical fiber array 103a is a ten-core fiber array. The probe card to 102a includes 18 electric probes 102 on each side (36 electric probes 102 in total). FIG. 3 illustrates a configuration of a unit cell 201 including the optical element to be inspected. The unit cell 201 includes electrodes 202 and grating couplers 203. Arrangement relationship between the optical fiber array 103a and the electric probes 102 is adjusted based on a circuit shape (circuit design). In other words, the positional relationship between the optical fiber array 103a and the electric probes 102 is adjusted by moving the optical fiber array 103a so as to coincide with the relative positional relationship between the grating couplers 203 as light input/output units and the electrodes 202 as contact portions of the electric probes 102.

The unit cell 201 illustrated in FIG. 3 is designed such that 18 (36 in total) electrodes 202 are arranged at a pitch of 125 μm on each of right and left sides in a vertical direction as a top-bottom direction of a paper surface of FIG. 3 and to grating couplers 203 are arranged at a pitch of 127 μm on a bottom side such that the pitch of the electrodes 202 and the pitch of the grating couplers 203 coincide with a pitch of the plurality of electric probes 102 and a pitch of the optical fiber array 103a, respectively.

As described above, the input/output positions of the electricity and the light for inspection are previously determined and desired optical/electric circuits are designed in other region, which makes it possible to measure optical characteristics of a plurality of optical/electric circuits (elements) at a time. As described above, in a case where the circuit to be measured of the wafer 151 is conveyed so as to contact with the electric probes 102 and the relative positional relationship between the electric probes 102 of the probe card 102a and the optical fiber array 103a is previously adjusted, alignment of the optical fiber array 103a is completed only by fine alignment after the wafer 151 is conveyed. As a result, repeating the function of the chip movement of the prober (second positioning mechanism) and the fine alignment of the optical fiber array 103a makes it possible to automatically measure all of the chips in the wafer 151, which largely reduces the measurement time.

As described above, the input/output positions of the electricity and the light for inspection are previously determined and desired optical/electric circuits are designed in other region, which makes it possible to measure optical characteristics of a plurality of optical/electric circuits (elements) at a time. As described above, in a case where the circuit to be measured of the wafer 151 is conveyed so as to contact with the electric probes 102 and the relative positional relationship between the electric probes 102 of the probe card 102a and the optical fiber array 103a is previously adjusted, alignment of the optical fiber array 103a is completed only by fine alignment after the wafer 151 is conveyed. As a result, repeating the function of the chip movement of the prober (second positioning mechanism) and the fine alignment of the optical fiber array 103a makes it possible to automatically measure all of the chips in the wafer 151, which largely reduces the measurement time.

With the above-described configuration, all of the unit cells 201 provided on the wafer 206 each have the same size. For example, the size of each of the unit cells 201 is set to 4.9 mm×2.9 mm, the size (mask size) of each of the dies 205 is set to 24.5 mm×23.2 mm, and the dies 205 are arranged on the wafer 206 having a diameter of 203.2 mm (8 inches). As described above, even when different elements are included in each of the unit cells 201, adopting the unit cells 201 each having the same standard (size and input/output positions of light/electricity) allows for inspection of all of the elements by a combination of the probe card 102a and the optical fiber array 103a.

To perform alignment of the optical fiber array 103a, it is sufficient for each of the dies 205 to include some kind of a circuit or an element for alignment. Examples of the circuit and the element include an optical circuit in which light is transmitted from one grating coupler to the other grating coupler, an optical circuit in which light returns to a grating coupler having received the light, and a circuit in which a photodetector is connected to a grating coupler.

Figure 5:
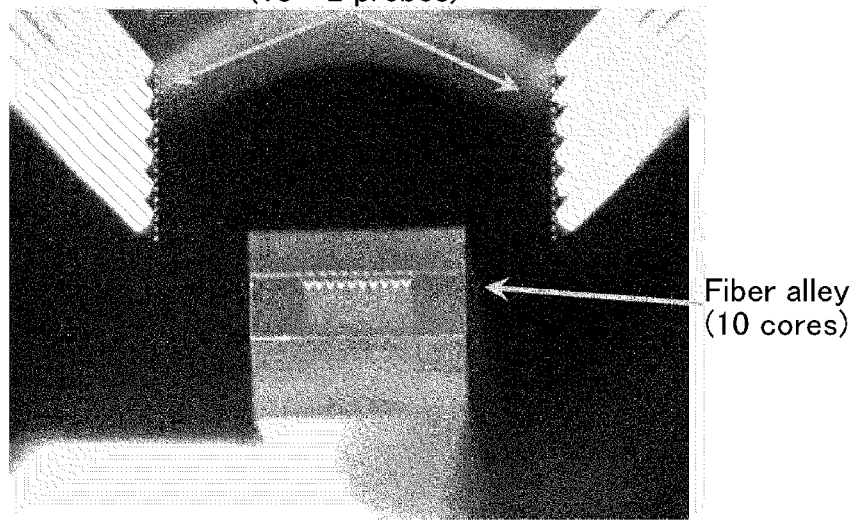
FIG. 5 is a photograph of electric probes and an optical fiber array captured from below.
Figure 6:
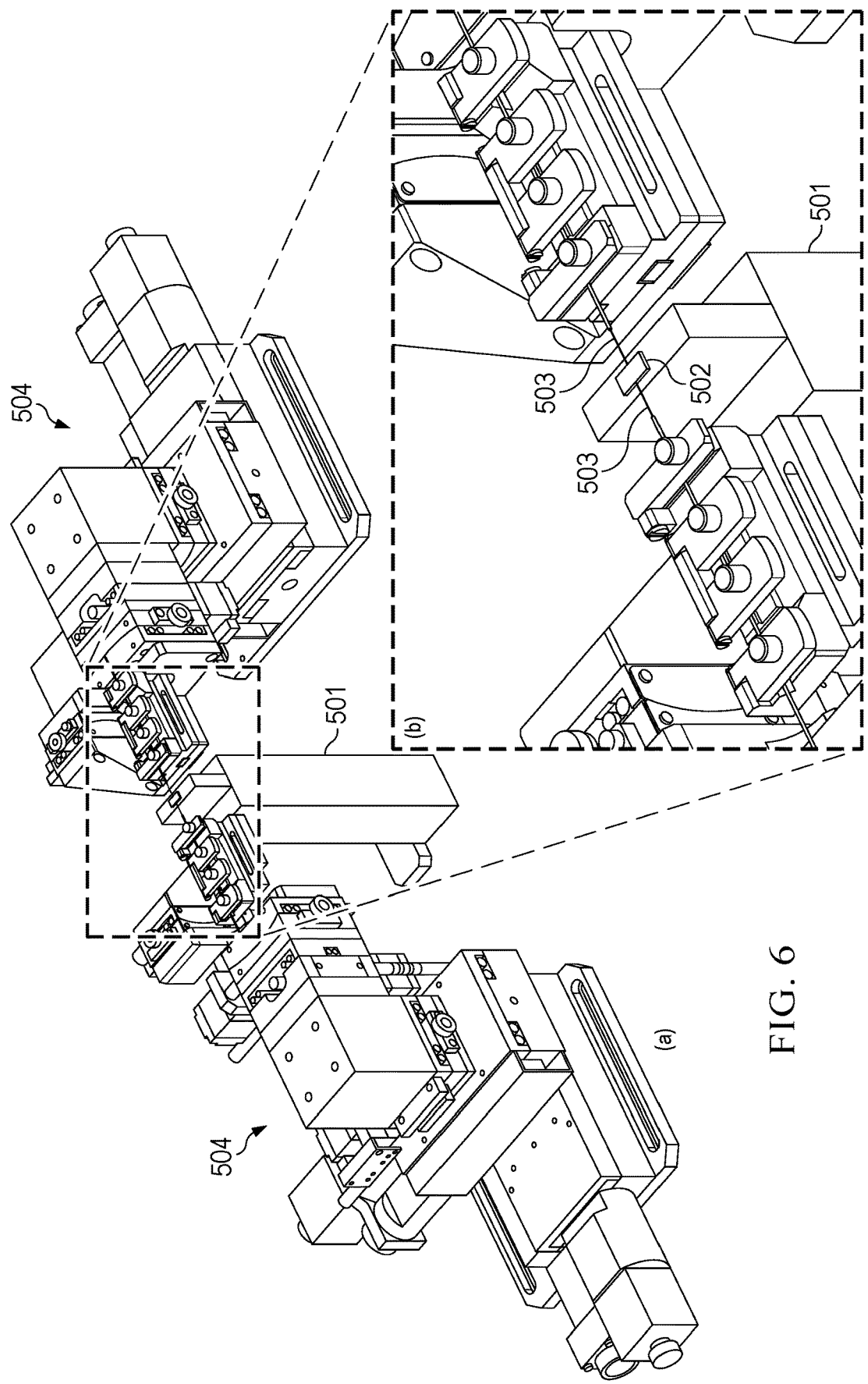
FIG. 6 is an image by computer graphics illustrating a configuration of an inspection apparatus performing inspection and measurement of an optical circuit.

As a method of adjusting the relative position between the optical fiber array 103a and the electric probes 102, there is a visual alignment method in which the relative position between the electric probes 102 and the optical fiber array 103a is measured from an image, and the optical fiber array 103a is moved to realize desired relative position. FIG. 5 illustrates an image obtained by observing the electric probes 102 and the optical fiber array 103a from below by using a camera that is provided in a prober in order to observe the needle-shaped electric probes 102.

A relative distance between an optional electric probe 102 and the optical fiber array 103a is measured, and positions of the optical fiber array 103a and the electric probes 102 are adjusted so as to coincide with circuit design values of the unit cell. Further, correcting arrangement angles of needle tips of the respective electric probes 102 and arrangement angles of fibers of the optical fiber array 103a in a rotation direction so as to coincide with the circuit design values makes it possible to perform alignment in the rotation direction. The angles are angles in the rotation direction around a line perpendicular to a paper surface of FIG. 5.

Further, in observation by the camera, the relative position in a height direction between the optical fiber array 103a and the electric probe 102 can be measured from focal lengths of the optical fiber array 103a and the electric probes 102. This makes it possible to adjust a distance in the height direction between the wafer 151 and the optical fiber array 103a.

Inspection is performed in the following manner by using the above-described inspection apparatus. First, in a first step, the wafer 151 including the plurality of optical elements each including the optical circuit to be inspected is placed (fixed) on the stage tot Next, in a second step, the first positioning mechanism 106 changes the relative positional relationship between the optical probe 103 and the optical connection portion of the optical elements on the wafer 151 fixed on the stage tot, thereby performing rough alignment between the optical probe 103 and the optical connection portion of the optical elements.

After the rough alignment between the optical probe 103 and the optical connection portion of the optical elements is performed, in a third step, alignment between the optical probe 103 and the optical connection portion of the optical elements is performed so as to maximize intensity of light entering the optical elements from the optical probe 103. In a case where a photodetector is provided in the circuit of each of the optical elements, the intensity of the light entering the optical circuit may be measured as intensity of a photocurrent photoelectrically converted by the photodetector, and the alignment may be performed so as to maximize the intensity of the photocurrent. Alternatively, alignment between the optical probe 103 and the optical connection portion of the optical elements is performed so as to maximize intensity of light output from the optical elements to the optical probe 103.

Next, in a fourth step, the second positioning mechanism provided (incorporated) in the stage 101 changes the relative positional relationship between the electric probes 102 and an electric connection portion of the optical elements, thereby performing positioning between the electric probes 102 and the electric connection portion of the optical elements. Thereafter, the electric probes 102 and the optical elements are electrically connected.

After alignment between the optical probe 103 and the optical connection portion of the optical elements is performed and the electric probes 102 and the optical elements are electrically connected as described above, in fifth step, electric measurement of the optical elements by the electric measurement device 104 and optical measurement of the optical elements by the optical measurement device 105 are performed.

According to the above-described embodiment, the positioning between the electric probes and the electrodes is performed by the second positioning mechanism as the wafer movement mechanism provided in the stage, and the positioning with positional accuracy of several µm is performable. In other words, the probe card (electric probes) is not moved but the wafer is moved. The relative position of the electrodes in the optional light/electric circuit element on the wafer and the optical coupling elements such as the grating couplers is determined by the circuit design. Therefore, when the relative position between the electric probes and the optical fibers is previously adjusted, the relative position between the grating couplers and the optical fibers is adjusted to a certain degree at completion of the positioning between the electric probes and the electrodes on the wafer.

As the positioning (alignment) accuracy between the grating couplers and the optical fibers, accuracy higher than several µm is required in the optical circuit having a small size, in particular, in a silicon optical circuit, etc. According to the above-described embodiment, however, it is only necessary to perform the fine alignment by the automatic stage for optical probe movement so as to maximize the intensity of the light entering the optical probe after completion of the positioning between the electric probes and the electrodes on the wafer. As compared with the existing technology, it is possible to simultaneously perform the electric positioning and the optical positioning in a short time.

Note that the wafer and the optical probe are movable in the above description; however, the electric probes may be movable. As long as the relative position of the three devices as the wafer, the electric probes, and the optical probe is adjustable, the devices may be moved in other combinations. Further, two pairs of facing stages may be used. The first positioning mechanism of the optical probe is not limited to the hexapod. The probe card may be a DC probe card or an RF probe card. The optical fiber array is not limited to the ten-core fiber array. The number of electric probes in the probe card is not limited to 18 electric probes on each side (36 electric probes in total). Further, the circuit and the element for optical alignment are not limited to the circuit and the element described above.

As described above, according to embodiments of the present invention, since the electric measurement device, the optical measurement device, the electric probes, and the optical probe are provided, it is possible to inspect the optical device in a shorter time.

According to embodiments of the present invention, it is possible to simultaneously measure the electric characteristics and the optical characteristics in a state of the wafer. In other words, the electric probes and the optical probe can simultaneously access the wafer. Further, the positioning of the electric probes and the alignment of the optical probe to the wafer are independently performable. As a result, according to embodiments of the present invention, it is possible to measure the optical device in the state of the wafer. In particular, in silicon photonics, electronic device characteristics can be measured by the same inspection apparatus, and both of the optical characteristics and the electric characteristics are obtainable at high speed. This largely reduces the time and the operation for the inspection, and reduces a cost of the optical device.

Note that the present invention is not limited to the above-described embodiments, and it should be appreciated that various modifications and combinations can be made by a person ordinarily skilled in the art within the technical idea of the present invention.

REFERENCE SIGNS LIST

101 Stage
102 Electric probe
103 Optical probe
104 Electric measurement device
105 Optical measurement device
106 First positioning mechanism
107 Prober housing
151 Wafer

The invention claimed is:

1. An inspection apparatus comprising:
   a stage on which a wafer is to be placed, the wafer comprising a plurality of optical elements each comprising an optical circuit to be inspected;
   an electric measurement device configured to perform electric measurement of each of the optical elements;
   an optical measurement device configured to perform optical measurement of each of the optical elements;
   a plurality of electric probes configured to electrically connect the electric measurement device and each of the optical elements; and
   an optical probe configured to optically connect the optical measurement device and each of the optical elements, wherein the optical probe is a multicore probe.

2. The inspection apparatus of claim 1, wherein the optical probe includes a plurality of optical fibers.

3. The inspection apparatus of claim 1, further comprising a probe card provided with the electric probes.

4. The inspection apparatus of claim 1, further comprising:
a first positioning mechanism configured to change a first relative positional relationship between the optical probe and an optical connection portion of each of the optical elements; and
a second positioning mechanism configured to change a second relative positional relationship between the electric probes and an electric connection portion of each of the optical elements.

5. The inspection apparatus of claim 4, wherein the first positioning mechanism is disposed above the second positioning mechanism.

6. The inspection apparatus of claim 4, wherein the first positioning mechanism is disposed above the wafer and the second positioning mechanism is disposed below the wafer.

7. The inspection apparatus of claim 4, wherein the stage includes the second positioning mechanism.

8. The inspection apparatus of claim 4, wherein the first positioning mechanism comprises a hexapod having six degrees of freedom.

9. The inspection apparatus of claim 1, wherein the optical probe is a single optical probe, and wherein light is input to/output from each of the optical elements by the single optical probe.

10. The inspection apparatus of claim 1, wherein the electric measurement device is configured to perform the electric measurement of each of the optical elements and the optical measurement device is configured to perform the optical measurement of each of the optical elements simultaneously.

11. An inspection method using an inspection apparatus comprising a stage on which a wafer is to be placed, the wafer comprising a plurality of optical elements each comprising an optical circuit to be inspected, an electric measurement device that performs electric measurement of each of the optical elements, an optical measurement device that performs optical measurement of each of the optical elements, a plurality of electric probes that electrically connects the electric measurement device and each of the optical elements, and an optical probe that optically connects the optical measurement device and each of the optical elements, the inspection method comprising:
placing the wafer on the stage;
performing rough alignment between the optical probe and an optical connection portion of the optical elements by causing a first positioning mechanism to change a first relative positional relationship between the optical probe and the optical connection portion of the optical elements;
after performing the rough alignment between the optical probe and the optical connection portion of the optical elements, performing fine alignment between the optical probe and the optical connection portion of the optical elements to maximize intensity of light entering the optical elements from the optical probe or intensity of light output from the optical elements to the optical probe;
performing positioning between the electric probes and an electric connection portion of the optical elements by causing a second positioning mechanism to change a second relative positional relationship between the electric probes and the electric connection portion of the optical elements;
electrically connecting the electric probes and the optical elements; and
after the electric probes and the optical elements are electrically connected and after the fine alignment between the optical probe and the optical connection portion of the optical elements is performed, performing the electric measurement of the optical elements by the electric measurement device and the optical measurement of the optical elements by the optical measurement device.

12. The inspection method of claim 11, wherein the optical probe includes a plurality of optical fibers.

13. The inspection method of claim 11, wherein the inspection apparatus further comprises a probe card provided with the electric probes.

14. The inspection method of claim 11, wherein the first positioning mechanism is disposed above the second positioning mechanism.

15. The inspection method of claim 11, wherein the optical probe is a multicore probe.

16. The inspection method of claim 11, wherein the optical probe is a single optical probe, and wherein light is input to/output from each of the optical elements by the single optical probe.

* * * * *